United States Patent [19]
Lee et al.

[11] Patent Number: 5,599,730
[45] Date of Patent: Feb. 4, 1997

[54] POLY-BUFFERED LOCOS

[75] Inventors: Kuo-Hua Lee; Chen-Hua D. Yu, both of Orlando, Fla.

[73] Assignee: Lucent Technologies Inc., Murray Hill, N.J.

[21] Appl. No.: 351,977

[22] Filed: Dec. 8, 1994

[51] Int. Cl.⁶ .................................................. H01L 21/76
[52] U.S. Cl. .................................. 437/69; 437/984
[58] Field of Search ........................... 437/69, 70, 924, 437/984, 968; 148/DIG. 102, DIG. 85, DIG. 86

[56] References Cited

U.S. PATENT DOCUMENTS

| 4,897,364 | 1/1990 | Nguyen et al. | 437/70 |
| 5,326,715 | 7/1994 | Jang et al. | 437/69 |

FOREIGN PATENT DOCUMENTS

| 62-232143 | 10/1987 | Japan. |
| 63-204746 | 8/1988 | Japan. |
| 63-252448 | 10/1988 | Japan. |
| 4739 | 1/1992 | Japan. |
| 2198882 | 6/1988 | United Kingdom. |

OTHER PUBLICATIONS

Park, T., "A Novel LOCOS–Type Isolation Free from the Field Oxide Thinning Effect", Extended Abstracts of the 1993 Int'l Conf. on Solid State Devices & Materials, Mukuhari, 1993, pp. 528–530.

*Primary Examiner*—George Fourson
*Attorney, Agent, or Firm*—John T. Rehberg

[57] ABSTRACT

A method of field oxide formation which creates field oxides of comparatively uniform height between differently-spaced oxidation masks is disclosed. A patterned oxidation mask, typically silicon nitride, (possibly with underlying polysilicon) is formed. A blanket layer of polysilicon is formed and etched back, thereby filling spaces between closely-spaced portions of the oxidation mask and fillets between less-closely spaced portions. A thermal oxidation is performed to produce a field oxide. The field oxide has comparatively uniform height despite differences in oxidation mask spacing.

6 Claims, 2 Drawing Sheets

5,599,730

POLY-BUFFERED LOCOS

TECHNICAL FIELD

This invention relates to integrated circuits and methods of manufacturing integrated circuits.

BACKGROUND OF THE INVENTION

Many modern integrated circuits are fabricated utilizing the "Local Oxidation of Silicon" (LOCOS) process. The LOCOS process involves the formation of a patterned layer, usually comprising silicon nitride, upon a silicon substrate. The exposed portions of the silicon substrate are subsequently oxidized to form silicon dioxide regions which are called field oxides.

An alternative to the LOCOS process is the poly-buffered LOCOS process ("PBL"). In the PBL process, a layer of stress relieving material, such as polysilicon is formed beneath the silicon nitride before oxidation of the silicon substrate. The polysilicon helps to absorb stresses generated during the oxidation process.

As integrated circuit geometries become smaller the spacing between adjacent portions of patterned silicon nitride (in the LOCOS process) or patterned silicon nitride and polysilicon (in the PBL process) has become smaller. For example, in FIG. 1, reference numeral 11 denotes a substrate which may be typically silicon. A thin oxide layer 13 may be formed on top of substrate 11. Reference numerals 15, 17 and 19 denote portions of a patterned polysilicon layer. Reference numerals 21, 23 and 25 denote portions of a patterned silicon nitride layer which is formed on top of respective portions 15, 17 and 19 of the patterned polysilicon layer.

It should be noted that the spacing between the patterned polysilicon—silicon nitride may vary. For example, the spacing denoted by $d_1$ (between polysilicon-silicon nitride elements 19–25 and 17–23) is smaller than the spacing denoted by $d_2$ (between polysilicon-silicon nitride elements 17–23 and 15–21). If spacing $d_1$ is significantly smaller than spacing $d_2$, the field oxide formed within spacing $d_1$ may be significantly shorter than the field oxide formed within spacing $d_2$. For example, in FIG. 1, the height of field oxide 29 which is located in spacing $d_1$ is less than the height of field oxide 27 which is located in spacing $d_2$. In other words, upper surface 33 of field oxide 29 is lower (i.e., closer to surface 33 of substrate 11) than upper surface 31 of field oxide 27.

However, it is desirable that most of the field oxides in a particular integrated circuit have the same or nearly the same height (as measured from the surface of the substrate). Differences in height, such as illustrated in FIG. 1, may cause complications in subsequent processing steps such as planarization or via etching. Furthermore, field oxides which are too short may not adequately separate overlying runners from the substrate and thus may permit the formation of parasitic transistors.

Those concerned with the development of integrated circuit technology have sought methods and structures which may alleviate the above-mentioned problem.

SUMMARY OF THE INVENTION

Illustratively, the present invention includes: forming at least one patterned layer which overlies a substrate and forming a blanket material layer over the patterned layer. Then the blanket material layer is anisotropically etched back, thereby creating fillets. The substrate is oxidized, thereby forming a field oxide.

DETAILED DESCRIPTION

Figure 2:
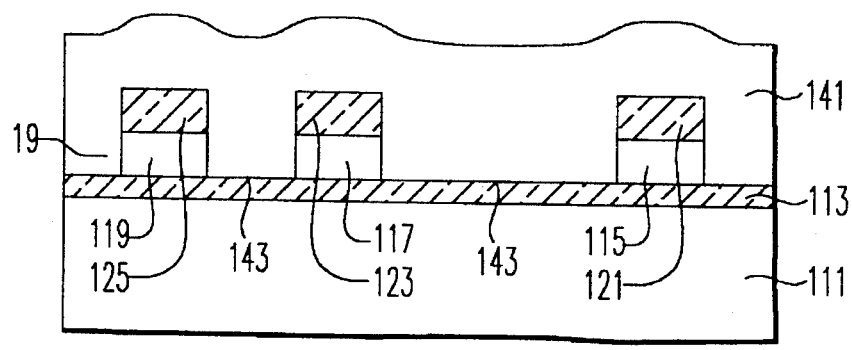
FIGS. 2–7 are cross sectional views which show two illustrative embodiments of the present invention.

In FIG. 2, reference numeral 111 denotes a substrate which, illustratively, may be silicon, epitaxial silicon, doped silicon or polysilicon. In general, the term substrate refers to a material upon which other material layers may be formed.

Oxide layer 113 is formed upon substrate 111. Typical desirable thicknesses for layer 113 are between 100 and 300 Å.

Reference numerals 119, 117 and 115 denote patterned stress relief layers which typically may be polysilicon having a thickness between 400 and 1000 Å.

Overlying patterned layers 119, 117 and 115 are silicon nitride layers 125, 123 and 121 respectively. Typically the thickness of the silicon nitride is between 1500 Å and 2500 Å.

A preferred method for forming layers 119, 117, 115, 125, 123 and 121 is to form a blanket layer of stress-relieving material overlying substrate 111 and then form a blanket layer of silicon nitride (or other material capable of inhibiting oxygen penetration into substrate 111) which overlies the stress relief layer. Then, illustratively, the silicon nitride and polysilicon blanket layers are patterned to create individual silicon-nitride-polysilicon layer pairs, such as 125 and 119, 123 and 117, and 121 and 115. Portions 143 and 144 of oxide 113 are thereby exposed.

It will be noted in FIG. 2 that the space between polysilicon-silicon nitride pairs 125–119 and 123–117 is smaller than the space between polysilicon-silicon nitride pairs 123–117 and 121–115. In other words, exposed area 144 is smaller than exposed area 143.

Next, a blanket layer of silicon, typically polysilicon, 141 is formed. Blanket layer 141 contacts exposed portions 143 and 144 of oxide 113 and also contacts upper portions of silicon nitride layers 125, 123 and 121.

Figure 3:
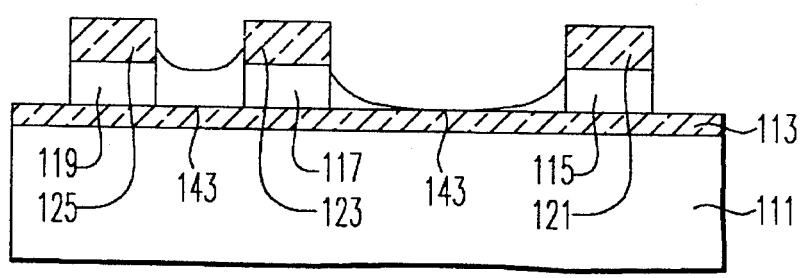

In FIG. 3, layer 141 has been anisotropically etched back to expose the tops of silicon nitride layers 125, 123, and 121. The etchback process tends to remove most of polysilicon layer 141 from regions in which the polysilicon-silicon nitride pairs (such as 123–117 and 121–115) are spaced far apart, while permitting a substantial amount of polysilicon to remain between closely-spaced polysiliconsilicon nitride pairs (such as 125–119 and 123–117).

Thus, in FIG. 3, after the anisotropic etchback step, portion 143 of oxide 113 is exposed, with concave fillets 147 and 149 of polysilicon remaining adjacent polysilicon-silicon nitride pairs 123–117 and 121–115. (Fillets may be completely missing if adjacent polysilicon-silicon nitride pairs are too far apart.) However, a comparatively thick layer 145 of polysilicon covers portion 144 of oxide 113 between closely spaced polysilicon-silicon nitride pairs 125–119 and 123–117. Layer 145 of polysilicon has a slightly concave upper surface 146.

Figure 4:
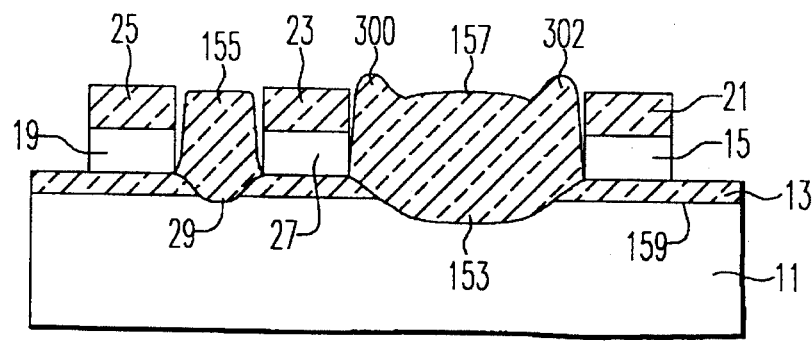

Turning to FIG. 4, an oxidation step is performed. Illustratively, the oxidation may be carried out by thermal oxidation in steam or oxygen at temperatures between 900°

C. and 1100° C. Oxidation of polysilicon layer 145, and polysilicon fillets 147 and 149, together with substrate 111 occurs.

Figure 1:
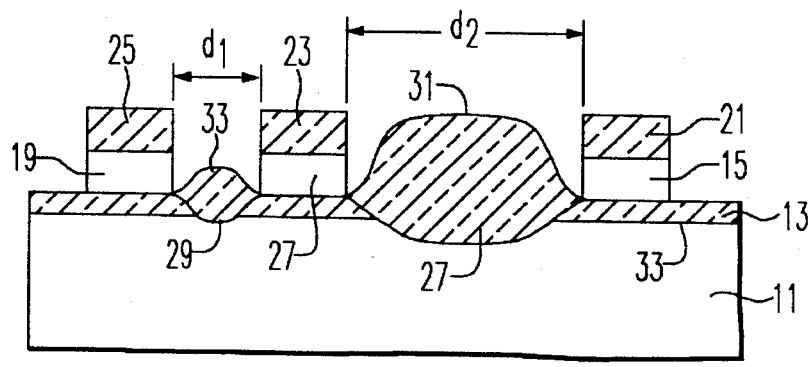
FIG. 1 depicts a prior art PBL process.

Oxides 151 and 153 are formed by the oxidation step. Oxides 151 and 153 may, typically, be field oxides in subsequently-formed integrated circuits. Principal upper surface 155 of oxide 151 protrudes approximately the same distance above the upper surface of substrate 111 as principal upper surface 157 of oxide 153 because polysilicon layer 145 covers comparatively small surface 144, while only fillets 147 and 149 remain to partially cover surface 143. The presence of a greater amount of oxidizable material between closely spaced features thus helps to create a variety of field oxides with approximately equal heights, thereby avoiding the problem illustrated in FIG. 1. The process produces field oxides with very small birds beaks. (Small protrusions 300 and 302 akin to birds beaks may be noted on larger oxides.

Figure 5:
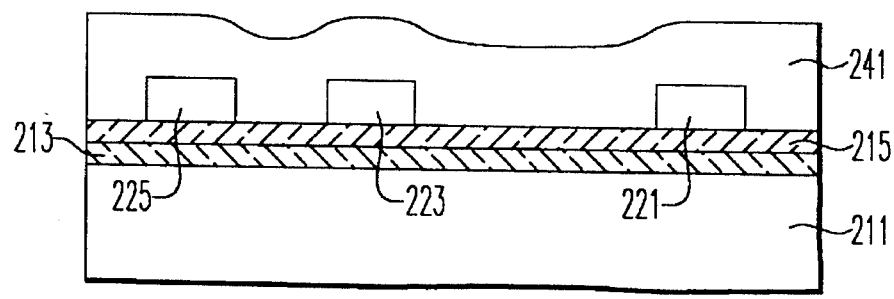
Figure 6:
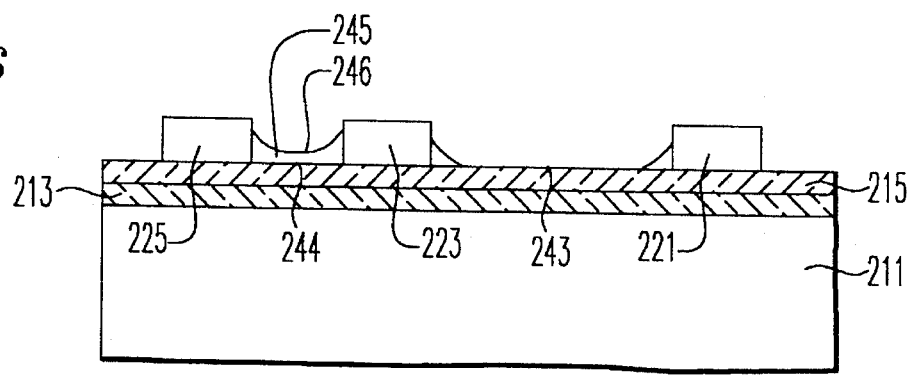
Figure 7:
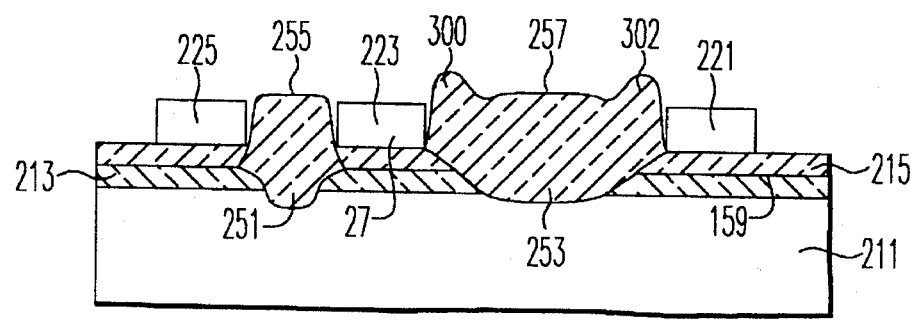

Another embodiment of the invention is illustrated in FIGS. 5–7. Substrate 211 may be silicon, epitaxial silicon, doped silicon, etc. Oxide 213, having a typical thickness between 100 and 300 Å is formed over substrate 211. Stress relief material layer 215, typically silicon, having a thickness between 400 and 1000 Å is formed over layer 213. Patterned oxidation inhibiting layers 225, 223 and 221, typically silicon nitride having a thickness between 1500 Å and 2500 Å, are formed over layer 215. (Layer 215 is not patterned, unlike the situation depicted in FIGS. 2–4.) Layers 225 and 223 are closer together than layers 223 and 221. Polysilicon layer 241 is blanket formed over layers 225, 223, 221 and 215.

In FIG. 6 layer 241 has been anisotropically etched back, leaving concave fillets 247 and 249 between layers 223 and 221. Upper surface 243 of layer 215 is exposed. By contrast, surface 244 of layer 215 between closely spaced layers 225 and 223 is covered by layer 245, having upper concave surface 246.

In FIG. 7 an oxidation step has been performed. The oxidation may be performed in steam or oxygen typically between temperatures of 900° C. and 100° C. Portions of substrate 211, together with portions of layer 215, together with layer 245 and fillets 247 and 249 are oxidized to create oxides 251 and 253. Oxides 251 and 253, which may be field oxides, are formed. Principal upper surfaces 255 and 257 of oxides 251 and 253 have approximately equal heights above substrate 211.

The thicknesses of various layers (for example, layers 215, 115, 241, 141), and the duration and extent of the anisotropic etchback process (which produces FIGS. 6 and 3) may be chosen in conjunction with the circuit design (which determines spacing between silicon nitride layers such as 125, 123, 121 and 225, 223 and 221) to produce field oxides of approximately equal height.

We claim:
1. A method of integrated circuit fabrication comprising:
   forming at least one patterned layer which overlies a substrate;
   said patterned layer having at least one first pair of raised topographic features and one second pair of raised topographic features, the distance between said first pair of topographic features being less than the distance between said second pair of topographic features;
   forming a blanket material layer over said patterned layer;
   anisotropically etching back said blanket material layer, thereby creating fillets adjacent said second pair of topographic features and removing the rest of said blanket material layer between said second pair of topographic features; a continuous layer of said blanket material layer remaining between said first topographic features;
   oxidizing said substrate and said fillets and said remaining continuous layer, thereby forming a field oxide.
2. The method of claim 1 in which said patterned layer is silicon nitride.
3. The method of claim 1 in which a stress relief layer is formed beneath and in contact with said patterned layer.
4. The method of claim 3 in which said stress relief layer is polysilicon.
5. The method of claim 1 in which said blanket layer is polysilicon.
6. A method of semiconductor integrated circuit fabrication comprising:
   forming a layer of silicon dioxide upon a silicon substrate;
   forming a first layer of polysilicon upon said layer of silicon dioxide;
   forming a layer of silicon nitride upon said layer of polysilicon;
   patterning said layer of silicon nitride, thereby exposing portions of said polysilicon layer and forming at least one pair of closely spaced silicon nitride features and at least one pair of distantly spaced silicon nitride features;
   forming a blanket layer of polysilicon upon said patterned silicon nitride features and upon the said exposed portions of said first polysilicon layer;
   anisotropically etching back said blanket layer, thereby forming fillets between said distantly spaced features and exposing a portion of said first polysilicon layer between said distantly spaced silicon nitride features, a portion of said blanket layer covering that portion of said first polysilicon layer between said closely spaced silicon nitride features;
   oxidizing said silicon substrate and the remaining portions of said blanket layer,
   to thereby create field oxides.

\* \* \* \* \*